US009690211B2

(12) United States Patent
Shi et al.

(10) Patent No.: US 9,690,211 B2
(45) Date of Patent: Jun. 27, 2017

(54) EXPOSURE SYSTEM

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Dawei Shi, Beijing (CN); Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 125 days.

(21) Appl. No.: 14/500,260

(22) Filed: Sep. 29, 2014

(65) Prior Publication Data

US 2015/0261101 A1    Sep. 17, 2015

(30) Foreign Application Priority Data

Mar. 17, 2014    (CN) .......................... 2014 1 0099166

(51) Int. Cl.
*G03F 7/20*    (2006.01)
(52) U.S. Cl.
CPC ........ *G03F 7/70608* (2013.01); *G03F 7/7055* (2013.01); *G03F 7/70191* (2013.01);
(Continued)
(58) Field of Classification Search
CPC ............. G03F 7/70558; G03F 7/70608; G03F 7/7055; G03F 7/70625; G03F 7/70508; G03F 7/70525; G03F 7/70191
See application file for complete search history.

(56) References Cited

U.S. PATENT DOCUMENTS

| 2002/0106821 A1* | 8/2002 | Bode ................... G03F 7/70558 |
| | | 438/16 |
| 2003/0039896 A1* | 2/2003 | Iriguchi ............... G03F 7/7035 |
| | | 430/5 |

(Continued)

FOREIGN PATENT DOCUMENTS

| CN | 102566288 A | 7/2012 |
| CN | 102778202 A | 11/2012 |

(Continued)

OTHER PUBLICATIONS

Notification of the First Office Action dated Apr. 23, 2015 corresponding to Chinese application No. 201410099166.3.

*Primary Examiner* — Michelle M Iacoletti
(74) *Attorney, Agent, or Firm* — Nath, Goldberg & Meyer; Joshua B. Goldberg; Christopher Thomas

(57) ABSTRACT

The present invention provides an exposure system including a light source and a carrier which are arranged opposite to each other. The carrier is used for placing a to-be-exposed film, and the to-be-exposed film is to be exposed to light emitted from the light source. The exposure system further includes a thickness measurement unit and a light intensity adjustment unit which are electrically connected to each other. The thickness measurement unit is used for measuring thicknesses of different regions of the to-be-exposed film, and the light intensity adjustment unit is used for adjusting exposure-light intensities of different regions of the to-be-exposed film according to the thicknesses of corresponding regions of the to-be-exposed film measured by the thickness measurement unit.

13 Claims, 3 Drawing Sheets

(52) U.S. Cl.
CPC ...... *G03F 7/70508* (2013.01); *G03F 7/70525* (2013.01); *G03F 7/70558* (2013.01); *G03F 7/70625* (2013.01)

(56) References Cited

U.S. PATENT DOCUMENTS

2007/0190438 A1* 8/2007 Kim ................. G03B 27/72
430/30
2010/0159372 A1* 6/2010 Kanaoka ........... H01L 21/67288
430/30

FOREIGN PATENT DOCUMENTS

| | | |
|---|---|---|
| CN | 102967957 A | 3/2013 |
| JP | 2012037365 A | 2/2012 |
| WO | 2013023876 A1 | 2/2013 |

* cited by examiner

-- PRIOR ART --

EXPOSURE SYSTEM

FIELD OF THE INVENTION

The present invention relates to the field of display technology, and in particular, relates to an exposure system.

BACKGROUND OF THE INVENTION

With the improvement of people's living standards, people's demand for the stability of a liquid crystal display is becoming higher and higher. Thus, it is required that patterns of various functional layers (e.g., an active layer, a source, a drain, a data line, a gate line, a pixel electrode, respective insulating layers, etc.) of a display panel have a good uniformity of size.

It is known that, in the formation of various functional layers of a display panel, the functional layers are generally subject to a lithography process usually including four procedures: photoresist coating, exposure, development, and etching, wherein the process capability and stability of each procedure have a direct influence on the sizes of patterns of various finally-formed functional layers. For example, nonuniformity in photoresist coating will directly result in nonuniformity of the sizes of patterns of various functional layers formed after exposure, then, the procedure of exposure will directly result in nonuniformity of the sizes of patterns of various functional layers after development, further, the procedure of development directly results in nonuniformity of the sizes of patterns of various functional layers after etching, all of which will severely affect the performance of the display panel.

In an actual lithography process, the inventors found that in the procedure of photoresist coating, a thickness of the photoresist-film layer normally coated on a glass substrate generally tends to be thin in the central region and thick in the periphery, and there is a case where the thicknesses of different positions in different regions are irregular. Furthermore, the inventors also found that even for different glass substrates in the same batch, the coating thicknesses of the photoresist-film layers are not entirely the same. It can be said that the thicknesses of photoresist-film layers in different glass substrates and in different positions of a single glass substrate are different in a procedure of photoresist coating.

The structure of a conventional exposure apparatus is shown in FIG. 1 (a mirror projection exposure apparatus is taken as an example here). A photoresist-film layer 8 is directly exposed to light emitted from a light source 1 and having passed through a mask plate 6 and a lens group 7. Since exposure-light intensities in different positions or regions of the photoresist-film layer 8 are the same, with this exposure apparatus, patterns of various functional layers formed after exposure will be non-uniform in size, which easily results in defects in various functional layers, and even affects the stability of a liquid crystal panel.

SUMMARY OF THE INVENTION

In view of the above technical problem in the prior art, the present invention provides an exposure system. The exposure system is provided with a thickness measurement unit and a light intensity adjustment unit so as to solve the problem of poor uniformity of size of a pattern formed on a to-be-exposed film after exposure due to nonuniformity of thicknesses of different regions of the to-be-exposed film. As a result, patterns of various functional layers in a display panel of a display product have a better uniformity of size, and the performance of the display product is more stable.

The present invention provides an exposure system including a light source and a carrier which is arranged opposite to the light source and is used for placing a to-be-exposed film which is to be exposed to light emitted from the light source, wherein the exposure system further includes a thickness measurement unit and a light intensity adjustment unit which are electrically connected to each other, the thickness measurement unit is used for measuring thicknesses of different regions of the to-be-exposed film, and the light intensity adjustment unit is used for adjusting exposure-light intensities of different regions of the to-be-exposed film according to the thicknesses of corresponding regions of the to-be-exposed film measured by the thickness measurement unit.

Preferably, the thickness measurement unit includes a measurement light source, a light splitting element, a light collection module, and a processing module, the light splitting element is opposite to the carrier, light emitted from the measurement light source irradiates onto the to-be-exposed film through the light splitting element, the light splitting element is used for splitting light reflected back from the to-be-exposed film to obtain a reflection spectrum, the light collection module is used for collecting the reflection spectrum and converting the reflection spectrum into an analog signal, and the processing module is used for processing the analog signal to obtain the thicknesses of the to-be-exposed film and sending the thicknesses of the to-be-exposed film to the light intensity adjustment unit.

Preferably, the light intensity adjustment unit includes an adjustment module and a conversion module, the adjustment module includes two transparent substrates which are aligned and assembled and liquid crystal filled between the two transparent substrates, and further includes a control circuit used for controlling the liquid crystal to rotate, the control circuit and the conversion module are electrically connected to each other, the conversion module is used for receiving the thicknesses of the to-be-exposed film, converting the thicknesses into electrical signals controlling the liquid crystal to rotate, and sending the electrical signals to the control circuit, the control circuit is used for controlling the rotation of the liquid crystal through the electrical signals, the two transparent substrates are capable of being arranged opposite to the to-be-exposed film, and the adjustment module is used for adjusting the exposure-light intensities of the to-be-exposed film through the rotation of the liquid crystal.

Preferably, the processing module includes an A/D conversion sub-module and a computation sub-module, the A/D conversion sub-module is electrically connected to both the light collection module and the computation sub-module, and is used for converting the analog signal into a digital signal, and the computation sub-module is used for computing to obtain the thicknesses of the to-be-exposed film according to the digital signal.

Preferably, the to-be-exposed film is divided into a plurality of to-be-exposed regions, the thickness measurement unit is capable of measuring the thickness of each of the to-be-exposed regions of the to-be-exposed film, and the light intensity adjustment unit is capable of adjusting an exposure-light intensity of each to-be-exposed region according to the thickness of the to-be-exposed region of the to-be-exposed film.

Preferably, the thickness measurement unit further includes a coordinate identification module, the light intensity adjustment unit further includes a coordinate matching module which is electrically connected to both the coordinate identification module and the control circuit, the coordinate identification module is used for identifying coordinates of each of to-be-exposed regions of the to-be-exposed film, and sending the coordinates to the coordinate matching module, the coordinate matching module is used for receiving the coordinates and matching the coordinates with a corresponding to-be-exposed region of the to-be-exposed film, and the control circuit is used for controlling the rotation of the liquid crystal according to a coordinate matching result when the corresponding to-be-exposed region of the to-be-exposed film is exposed.

Preferably, the exposure system further includes a movement mechanism which is connected to the thickness measurement unit, used for moving the thickness measurement unit to different regions of the to-be-exposed film, and used for moving the thickness measurement unit beyond the to-be-exposed film after completion of measurement.

Preferably, the exposure-light intensities of different regions of the to-be-exposed film are proportional to the thicknesses of corresponding regions of the to-be-exposed film.

Preferably, a mask plate is further arranged between the light source and the carrier, the mask plate is used for forming different patterns on the to-be-exposed film, and is arranged at a light incident side or a light emergent side of the adjustment module.

Preferably, the mask plate is attached to any one of the two transparent substrates.

Preferably, the exposure system further includes a lens group, which is arranged between the mask plate and the carrier, and is used for equimultiple imaging a pattern on the to-be-exposed film, such that a pattern with the same shape and size as those of the pattern of the mask plate is formed on the to-be-exposed film after exposure.

Preferably, the exposure system further includes a position control mechanism, the position control mechanism is connected to the light intensity adjustment unit and used for controlling movement of the light intensity adjustment unit, or, the position control mechanism is connected to the carrier and used for controlling movement of the carrier, so that the light intensity adjustment unit moves relative to the to-be-exposed film so as to perform scanning exposure on the to-be-exposed film.

The advantageous effects of the present invention are as follows: the exposure system according to the present invention is provided with a thickness measurement unit and a light intensity adjustment unit so as to adjust exposure-light intensities of different regions of a to-be-exposed film according to different thicknesses of corresponding regions of the to-be-exposed film. Thus, the problem of poor uniformity of size of a pattern formed on the to-be-exposed film after exposure due to nonuniformity of thicknesses of different regions of the to-be-exposed film is solved. That is, a pattern formed on the to-be-exposed film after exposure has a better uniformity of size. As a result, patterns of various functional layers in a display panel of a display product have a better uniformity of size, thus defects in various functional layers are avoided, and the performance of the display product is more stable.

REFERENCE SIGNS

1—light source; 2—carrier; 3—to-be-exposed film; 4—thickness measurement unit; 41—measurement light source; 42—light splitting element; 43—light collection module; 44—processing module; 441—A/D conversion sub-module; 442—computation sub-module; 45—coordinate identification module; 5—light intensity adjustment unit; 51—adjustment unit; 511—transparent substrate; 512—liquid crystal; 513—control circuit; 52—conversion module; 53—coordinate matching module; 6—mask plate; 7—lens group; 71—trapezoidal lens; 72—convex mirror; 73—concave mirror; 8—photoresist-film layer.

DETAILED DESCRIPTION OF THE EMBODIMENTS

To give a better understanding of the solutions of the present invention for a person skilled in the art, the exposure system according to the present invention will be described in detail with reference to the drawings and the specific embodiments in the following.

Embodiment 1

Figure 1:
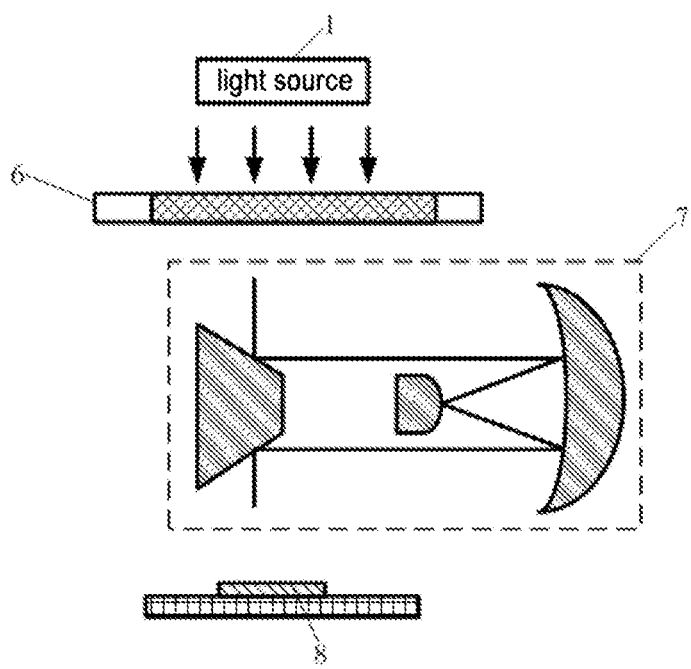
FIG. 1 is a schematic diagram showing a structure of an exposure apparatus in the prior art.
Figure 2:
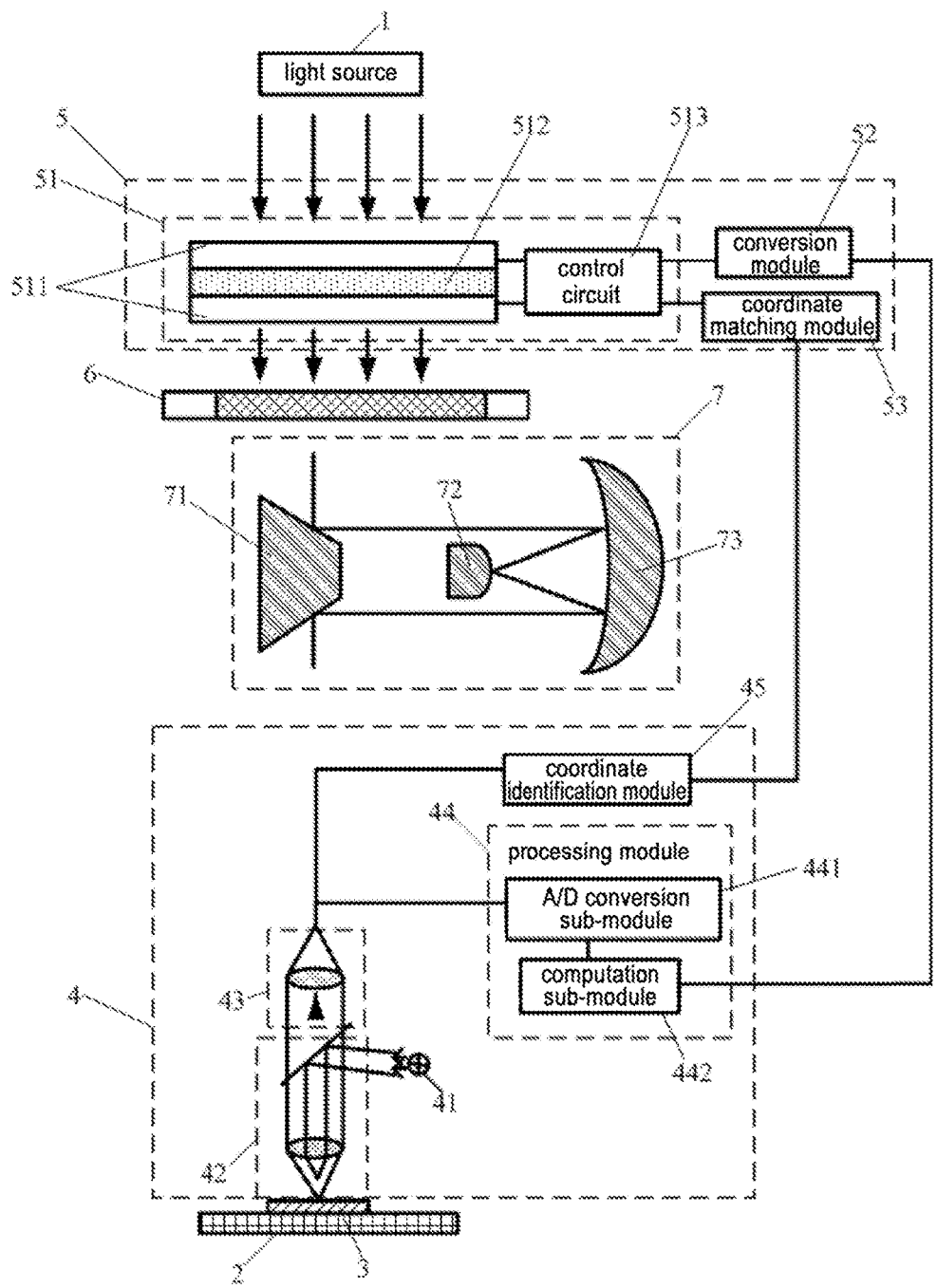
FIG. 2 is a schematic diagram showing a structure of an exposure system according to Embodiment 1 of the present invention.

The present embodiment provides an exposure system. As shown in FIG. 2, the exposure system includes a light source 1 and a carrier 2 which are arranged opposite to each other. The carrier 2 is used for placing a to-be-exposed film 3, and the to-be-exposed film 3 is to be exposed to light emitted from the light source 1. The exposure system further includes a thickness measurement unit 4 and a light intensity adjustment unit 5 which are electrically connected to each other. The thickness measurement unit 4 is used for measuring thicknesses of different regions of the to-be-exposed film 3, and the light intensity adjustment unit 5 is used for adjusting exposure-light intensities of different regions of the to-be-exposed film 3 according to the thicknesses of corresponding regions of the to-be-exposed film 3 measured by the thickness measurement unit 4.

Generally, the to-be-exposed film 3 may be directly used as a certain functional layer (e.g., a gate insulating layer, a passivation layer, a flat layer, a spacer, or the like of a liquid crystal display panel) in a display panel of a display product, or may be photoresist coated on a film layer constituting a functional layer (e.g., an active layer, a source, a drain, a data line, a gate line, a pixel electrode, or the like). The photoresist is used for forming a pattern of the functional layer in display panel of the display product after exposure.

The thickness measurement unit 4 and the light intensity adjustment unit 5 are provided so that the exposure system can adjust exposure-light intensities of different regions of the to-be-exposed film 3 according to different thicknesses of corresponding regions of the to-be-exposed film 3, which can solve the problem of poor uniformity of size of a pattern formed on the to-be-exposed film 3 after exposure due to nonuniformity of thicknesses of different regions of the to-be-exposed film 3. That is, size of a pattern formed on the to-be-exposed film 3 after exposure becomes more uniform. As a result, patterns of various functional layers in a display panel of a display product have a better uniformity of size, thus defects in various functional layers are avoided, and the performance of the display product is more stable.

In the present embodiment, the thickness measurement unit 4 includes a measurement light source 41, a light splitting element 42, a light collection module 43, and a processing module 44. The light splitting element 42 is opposite to the carrier 2. Light emitted from the measurement light source 41 irradiates onto the to-be-exposed film 3 through the light splitting element 42. The light splitting element 42 is used for splitting light reflected back from the to-be-exposed film 3 to obtain a reflection spectrum. The light collection module 43 is used for collecting the reflection spectrum and converting the reflection spectrum into an analog signal. The processing module 44 is used for processing the analog signal to obtain the thicknesses of the to-be-exposed film 3 and sending the thicknesses of the to-be-exposed film 3 to the light intensity adjustment unit 5.

Wherein, the processing module 44 includes an A/D (analog to digital) conversion sub-module 441 and a computation sub-module 442. The A/D conversion sub-module 441 is electrically connected to both the light collection module 43 and the computation sub-module 442, and is used for converting an analog signal into a digital signal. The computation sub-module 442 is used for computing to obtain the thicknesses of the to-be-exposed film 3 according to the digital signal. If the thicknesses of different regions of the to-be-exposed film 3 are nonuniform, the reflection spectrum (e.g., an intensity, a wavelength, or the like) collected by the light collection module 43 will be different. As a result, the analog signal converted from the reflection spectrum will be different, and thus the resultant digital signal will be different. Different digital signals correspond to different thicknesses, hereby the thicknesses of the to-be-exposed film can be obtained.

The thickness measurement unit 4 is provided so that measurement of thicknesses of different regions of the to-be-exposed film 3 can be more accurate, and the measurement process can be more simple and convenient. Thus, both the operation efficiency and operation quality of the overall exposure system can be improved.

The light intensity adjustment unit 5 includes an adjustment module 51 and a conversion module 52. The adjustment module 51 includes two transparent substrates 511 which are aligned and assembled and liquid crystal 512 filled between the two transparent substrates 511, and further includes a control circuit 513 used for controlling the liquid crystal 512 to rotate. The control circuit 513 and the conversion module 52 are electrically connected to each other. The conversion module 52 is used for receiving the thicknesses of the to-be-exposed film 3, converting the thicknesses into an electrical signal controlling the liquid crystal 512 to rotate, and sending the electrical signal to the control circuit 513. The control circuit 513 is used for controlling the rotation of the liquid crystal 512 through the electrical signal. The two transparent substrates can be arranged opposite to the to-be-exposed film 3. The adjustment module 51 is used for adjusting the exposure-light intensities of the to-be-exposed film 3 through the rotation of the liquid crystal 512.

The disposition of the light intensity adjustment unit 5 enables different regions of the to-be-exposed film 3 to receive different exposure-light intensities according to different thicknesses thereof, and thus size of a pattern formed on the entire to-be-exposed film 3 after exposure is more uniform.

In the present embodiment, the to-be-exposed film 3 is divided into a plurality of to-be-exposed regions. The thickness measurement unit 4 can measure the thickness of each of to-be-exposed regions of the to-be-exposed film 3. The light intensity adjustment unit 5 can adjust an exposure-light intensity of each to-be-exposed region according to the thickness of the to-be-exposed region of the to-be-exposed film 3. Here, the exposure-light intensity of each of to-be-exposed regions of the to-be-exposed film 3 is directly proportional to the thickness of the to-be-exposed region of the to-be-exposed film 3, so that uniformity of size of a pattern formed on the to-be-exposed film 3 after exposure can be ensured.

It should be noted that, if a to-be-exposed region is small enough, it can be regarded as a measurement point. Additionally, a thickness obtained by measuring a measurement point of the to-be-exposed film 3 may be taken as a representative value of a to-be-exposed region in which the measurement point is located. Of course, the more measurement points to be measured in a to-be-exposed region there are, the more accurate the resultant thickness of the to-be-exposed region is. Thus, an exposure-light intensity supplied to the to-be-exposed region is more appropriate.

In the present embodiment, the thickness measurement unit 4 further includes a coordinate identification module 45. The light intensity adjustment unit 5 further includes a coordinate matching module 53, and the coordinate matching module 53 is electrically connected to both the coordinate identification module 45 and the control circuit 513. The coordinate identification module 45 is used for identifying coordinates of each of to-be-exposed regions of the to-be-exposed film 3, and sending the coordinates to the coordinate matching module 53. The coordinate matching module 53 is used for receiving the coordinates and matching the coordinates with a corresponding to-be-exposed region of the to-be-exposed film 3. The control circuit 513 is used for controlling the rotation of the liquid crystal 512 according to a coordinate matching result when the corresponding to-be-exposed region of the to-be-exposed film 3 is exposed.

The disposition of the coordinate identification module 45 and the coordinate matching module 53 enables an exposure-light intensity supplied to a to-be-exposed region of the to-be-exposed film 3 to accurately correspond to a thickness of the to-be-exposed region. Thus, it is possible to supply different exposure-light intensities according to thicknesses of different regions of the to-be-exposed film 3.

In the present embodiment, the exposure system further includes a movement mechanism (not shown in FIG. 2). The movement mechanism is connected to the thickness measurement unit 4, used for moving the thickness measurement unit 4 to different regions of the to-be-exposed film 3, and used for moving the thickness measurement unit 4 beyond the to-be-exposed film 3 after completion of measurement.

The disposition of the movement mechanism enables the thickness measurement unit 4 to be agilely moved to different regions of the to-be-exposed film 3 in real time, which facilitates the thickness measurement unit 4 to measure thicknesses of different regions or positions of the to-be-exposed film 3. In addition, after completion of measuring the thicknesses of the to-be-exposed film 3 and before start of exposure, it is necessary to move the thickness measurement unit 4 beyond the to-be-exposed film 3 so that the thickness measurement unit 4 will not block any to-be-exposed region of the to-be-exposed film 3. Thus, the disposition of the movement mechanism greatly facilitates the movement of the thickness measurement unit 4 between a work area and a non-work area.

In the present embodiment, a mask plate 6 can be arranged between the light source 1 and the carrier 2. The mask plate 6 is used for forming different patterns on the to-be-exposed film 3, and may be arranged at a light incident side or a light emergent side of the adjustment module 51. In the present embodiment, the mask plate 6 is arranged at a light emergent side of the adjustment module 51, and at a light emergent side of a transparent substrate 511 which is far away from the light source 1.

It should be noted that, the mask plate 6 may also be arranged at a light incident side or a light emergent side of the transparent substrate 511 which is close to the light source 1, or be arranged at a light incident side of a transparent substrate 511 which is far away from the light source 1, and an embodiment thereof will be described in Embodiment 2. No matter whether the mask plate 6 is arranged at a light incident side or a light emergent side of any transparent substrate 511, normal operation of the thickness measurement unit 4 and the light intensity adjustment unit 5 will not be affected.

In the present embodiment, the exposure system further includes a lens group 7. The lens group is arranged between the mask plate 6 and the carrier 2, and is used for equimultiple imaging a pattern on the to-be-exposed film 3, such that a pattern with the same shape and size as those of the pattern of the mask plate 6 is formed on the to-be-exposed film 3 after exposure. Wherein, the lens group 7 may include a trapezoidal lens 71, a convex mirror 72, and a concave mirror 73. The trapezoidal lens 71 is sandwiched between mask plate 6 and the carrier 2. The convex mirror 72 and the concave mirror 73 are arranged perpendicular to the carrier 2, and the central axes of the trapezoidal lens 71, the convex mirror 72, and the concave mirror 73 coincide with each other. The exposure system according to the present embodiment exposes the to-be-exposed film 3 to light in the manner of mirror projection. The specific operation principle and process of the lens group 7 are as follows: a light beam emergent from the mask plate 6 is reflected to the concave mirror 73 by one inclined surface of the trapezoidal lens 71, and is reflected to the convex mirror 72 by the concave mirror 73; then, after being reflected to the concave mirror 73 to converge by the convex mirror 72, the light beam is projected onto the to-be-exposed film 3 by another inclined surface of the trapezoidal lens 71, so that a pattern with the same shape and size as those of the pattern of the mask plate 6 is formed on the to-be-exposed film 3 after exposure.

Here, the trapezoidal lens 71 and the convex mirror 72 play the role of changing a light path. The concave mirror 73 plays the role of converging light, and the function of the concave mirror 73 is equivalent to imaging by a convex lens. When an object distance is equal to the double of a focal length, equimultiple imaging is performed. An image with the same size is projected onto the to-be-exposed film 3 after being reflected by the trapezoidal lens 71 and the convex mirror 72, so that a pattern with the same shape and size as those of the pattern of the mask plate 6 is formed on the to-be-exposed film 3 after exposure.

The distance between the light source 1 and the to-be-exposed film 3 is increased due to the disposition of the thickness measurement unit 4 and the light intensity adjustment unit 5, whereas, the lens group 7 can make a pattern formed on the to-be-exposed film 3 clearer by reflecting and converging exposure light.

Of course, the lens group herein may be a lens group with other structures, as long as the function of the above lens group can be realized. The present embodiment is not limited to the above lens group.

In the present embodiment, the exposure system may further include a position control mechanism (not shown in FIG. 2). The position control mechanism is connected to the light intensity adjustment unit 5 and used for controlling movement of the light intensity adjustment unit 5, or, the position control mechanism is connected to the carrier 2 and used for controlling movement of the carrier 2, so that the light intensity adjustment unit 5 moves relative to the to-be-exposed film 3 so as to perform scanning exposure on the to-be-exposed film 3.

A specific operation process of the above exposure system is as follows. For example, the entire to-be-exposed film 3 is divided into 16 to-be-exposed regions, and two to-be-exposed regions are exposed to light each time. Firstly, the thickness measurement unit 4 is moved to different positions of two to-be-exposed regions of the to-be-exposed film 3 which will be exposed to light through the movement mechanism. Next, thicknesses of different positions of the two to-be-exposed regions are measured, and information about the thicknesses of different positions of the two to-be-exposed regions of the to-be-exposed film 3 is recorded. Then, exposure-light intensities of corresponding regions of the to-be-exposed film 3 are adjusted by a certain method (which may be as follows: voltage values in different regions or at different positions of the transparent substrates are adjusted to be different through the control circuit 513, so as to control light transmittances in the regions or at the positions to be different; for example, for regions or positions with large thicknesses in the to-be-exposed film 3, when the corresponding regions or positions are exposed to light, voltage values in regions or at positions of the transparent substrates 511 corresponding to the regions or positions with large thicknesses are adjusted through the control circuit 513, so that liquid crystal molecules thereof rotate correspondingly, resulting in that light transmittances in these regions or at these positions are relatively large). When two to-be-exposed regions are exposed to light, processed information of thicknesses corresponding to thicknesses of the two to-be-exposed regions of the to-be-exposed film 3 is read, and amounts of light transmitting through various regions of the transparent substrates 511 above the mask plate 6 are adjusted through the control circuit 513. In this way, the two to-be-exposed regions can be exposed to light.

After completion of exposure of the two to-be-exposed regions, the light intensity adjustment unit 5 is controlled to move to positions corresponding to two other to-be-exposed regions through the position control mechanism, and the thickness measurement unit 4 is moved to different positions of these two to-be-exposed regions through the movement mechanism. Then the same measurement process and exposure process as above are performed until the entire to-be-exposed film 3 is exposed to light. Of course, the light intensity adjustment unit 5 may not be moved, while the carrier 2 is controlled to move through the position control mechanism. The carrier 2 moves so that the to-be-exposed film 3 placed on the carrier 2 moves, which finally makes the positions of the two to-be-exposed regions correspond to the light intensity adjustment unit 5. It should be noted that, in order to ensure uniformity of size of a pattern formed on the to-be-exposed film 3 after exposure, it is required to collect information of thicknesses of two to-be-exposed regions of the to-be-exposed film 3 each time, and comprehensive analysis is performed to calculate a transmittance distribution scheme of each to-be-exposed region. Then the two to-be-exposed regions are exposed to light.

A process of scanning exposure can be realized automatically through arrangement of the position control mechanism, and thus exposure efficiency is further improved.

Furthermore, it should be noted that the thickness measurement unit 4 and the light intensity adjustment unit 5 in the present embodiment are suitable for a proximity exposure system.

The advantageous effects of Embodiment 1 are as follows: through disposition of the thickness measurement unit and the light intensity adjustment unit, the exposure system according to Embodiment 1 can adjust exposure-light intensities of different regions of the to-be-exposed film according to different thicknesses of corresponding regions of the to-be-exposed film, which can solve the problem of poor uniformity of size of a pattern formed on the to-be-exposed film after exposure due to nonuniformity of thicknesses of different regions of the to-be-exposed film. That is, size of a pattern formed on the to-be-exposed film after exposure is more uniform. As a result, patterns of various functional layers in a display panel of a display product have a better uniformity of size, thus defects in various functional layers are avoided, and the performance of the display product is more stable.

Embodiment 2

Figure 3:
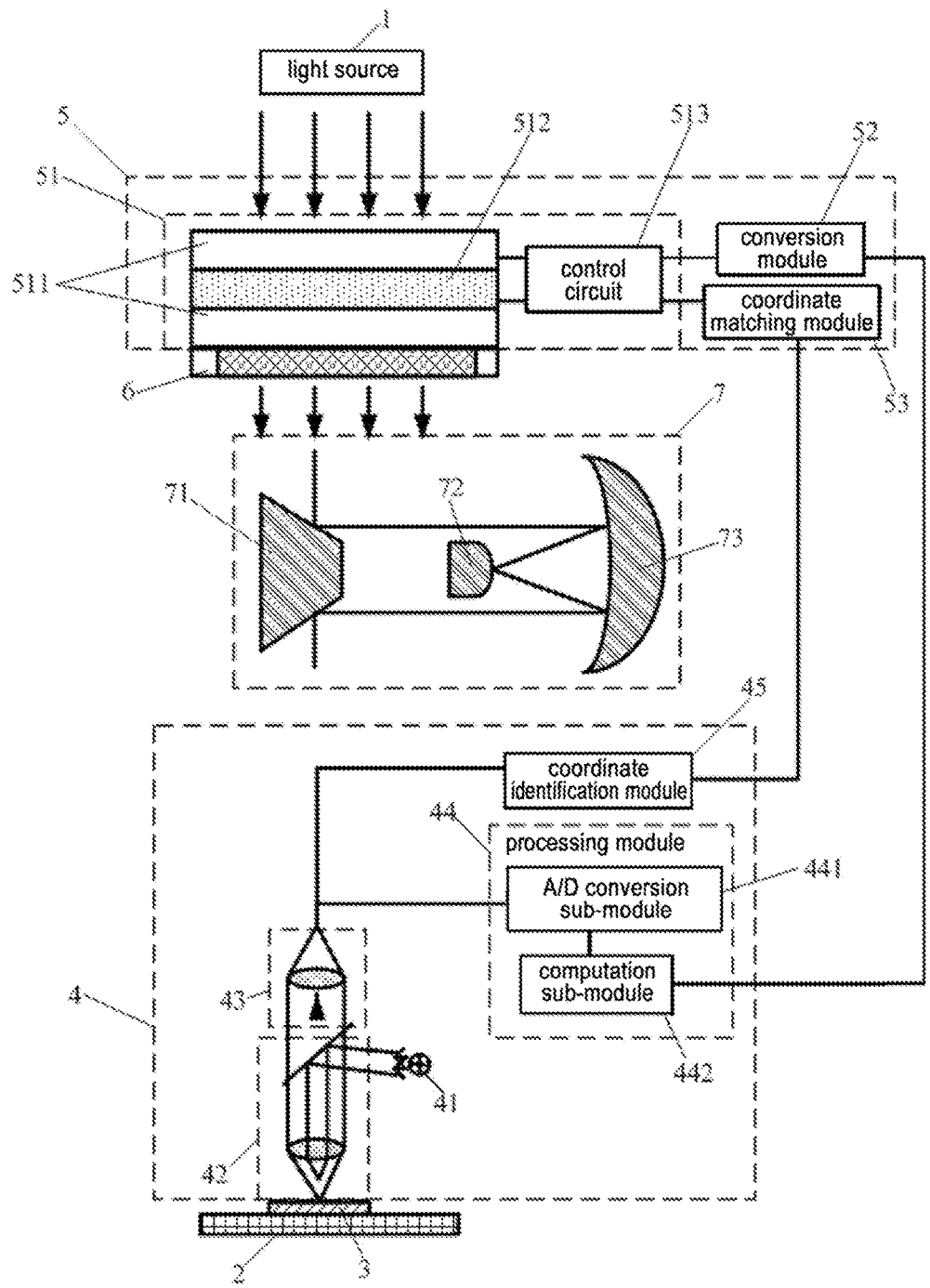
FIG. 3 is a schematic diagram showing a structure of an exposure system according to Embodiment 2 of the present invention.

The present embodiment provides an exposure system, which differs from the exposure system according to Embodiment 1 in that the mask plate 6 is attached to any one of the two transparent substrates 511. In the present embodiment, as shown in FIG. 3, the mask plate 6 is attached to a light emergent side of a transparent substrate 511 which is far away from the light source 1.

It should be noted that, the mask plate 6 may also be attached to a light incident side or a light emergent side of a transparent substrate 511 which is close to the light source 1, or be attached to a light incident side of a transparent substrate 511 which is far away from the light source 1. In addition, if cost is not considered, the mask plate 6 may be configured to be one of the two transparent substrates 511.

Other structures of the exposure system according to the present embodiment are the same as those of the exposure system according to Embodiment 1, thus description thereof is omitted here.

The advantageous effects of Embodiment 2 are as follows: with the mask plate attached to any one of the two transparent substrates, the space occupied by the exposure system according to Embodiment 2 can be saved. Similarly, through disposition of the thickness measurement unit and the light intensity adjustment unit, the exposure system according to Embodiment 2 can adjust exposure-light intensities of different regions of the to-be-exposed film according to different thicknesses of corresponding regions of the to-be-exposed film, which can solve the problem of poor uniformity of size of a pattern formed on the to-be-exposed film after exposure due to nonuniformity of thicknesses of different regions of the to-be-exposed film. That is, a pattern formed on the to-be-exposed film after exposure has a better uniformity of size. As a result, patterns of various functional layers in a display panel of a display product have a better uniformity of size, thus defects in various functional layers are avoided, and the performance of the display product is more stable.

It should be understood that, the foregoing embodiments are only exemplary embodiments used to explain the principle of the present invention, and the present invention is not limited thereto. Variations and improvements easily conceived by a person having ordinary skill in the art without departing from the spirit and essence of the present invention all fall within the protection scope of the present invention.

What is claimed is:

1. An exposure system including an exposure light source and a carrier which is arranged opposite to the exposure light source and configured for placing a to-be-exposed film which is to be exposed to light emitted from the exposure light source, wherein the exposure system further includes a thickness measurement unit and a light intensity adjustment unit which are electrically connected to each other, the thickness measurement unit is configured for measuring thicknesses of different regions of the to-be-exposed film, and the light intensity adjustment unit is configured for adjusting exposure-light intensities of different regions of the to-be-exposed film according to the thicknesses of corresponding regions of the to-be-exposed film measured by the thickness measurement unit;

wherein the thickness measurement unit includes a measurement light source, a light splitting element, a light collection module, and a processing module, the light splitting element is opposite to the carrier in a direction of the light emitted from the exposure light source, light emitted from the measurement light source irradiates directly onto the to-be-exposed film after passing through the light splitting element, the light splitting element is configured for splitting light reflected back from the to-be-exposed film to obtain a reflection spectrum, the light collection module is configured for collecting the reflection spectrum and converting the reflection spectrum into an analog signal, and the processing module is configured for processing the analog signal to obtain the thicknesses of the to-be-exposed film and sending the thicknesses of the to-be-exposed film to the light intensity adjustment unit.

2. The exposure system according to claim 1, wherein the light intensity adjustment unit includes an adjustment module and a conversion module, the adjustment module includes two transparent substrates which are aligned and assembled and liquid crystal filled between the two transparent substrates, and further includes a control circuit configured for controlling the liquid crystal to rotate, the control circuit and the conversion module are electrically connected to each other, the conversion module is configured for receiving the thicknesses of the to-be-exposed film, converting the thicknesses into electrical signals controlling the liquid crystal to rotate, and sending the electrical signals to the control circuit, the control circuit is configured for controlling the rotation of the liquid crystal through the electrical signals, the two transparent substrates are configured for being arranged opposite to the to-be-exposed film, and the adjustment module is configured for adjusting the exposure-light intensities of the to-be-exposed film through the rotation of the liquid crystal.

3. The exposure system according to claim 2, wherein the thickness measurement unit further includes a coordinate identification module, the light intensity adjustment unit further includes a coordinate matching module which is electrically connected to both the coordinate identification module and the control circuit, the coordinate identification module is configured for identifying coordinates of each of to-be-exposed regions of the to-be-exposed film, and sending the coordinates to the coordinate matching module, the coordinate matching module is configured for receiving the coordinates and matching the coordinates with a corresponding to-be-exposed region of the to-be-exposed film, and the control circuit is configured for controlling the rotation of the liquid crystal according to a coordinate matching result when the corresponding to-be-exposed region of the to-be-exposed film is exposed.

4. The exposure system according to claim 2, wherein a mask plate is further arranged between the exposure light source and the carrier, the mask plate is configured for forming different patterns on the to-be-exposed film, and is arranged at a light incident side or a light emergent side of the adjustment module.

5. The exposure system according to claim 4, wherein the mask plate is attached to any one of the two transparent substrates.

6. The exposure system according to claim 5, further including a lens group, which is arranged between the mask plate and the carrier, and is configured for equimultiple imaging a pattern on the to-be-exposed film, such that a pattern with the same shape and size as those of the pattern of the mask plate is formed on the to-be-exposed film after exposure.

7. The exposure system according to claim 6, further including a position control mechanism, the position control mechanism is connected to the light intensity adjustment unit and configured for controlling movement of the light intensity adjustment unit, or, the position control mechanism is connected to the carrier and configured for controlling movement of the carrier, so that the light intensity adjustment unit moves relative to the to-be-exposed film so as to perform scanning exposure on the to-be-exposed film.

8. The exposure system according to claim 4, further including a lens group, which is arranged between the mask plate and the carrier, and is configured for equimultiple imaging a pattern on the to-be-exposed film, such that a pattern with the same shape and size as those of the pattern of the mask plate is formed on the to-be-exposed film after exposure.

9. The exposure system according to claim 8, further including a position control mechanism, the position control mechanism is connected to the light intensity adjustment unit and configured for controlling movement of the light intensity adjustment unit, or, the position control mechanism is connected to the carrier and configured for controlling movement of the carrier, so that the light intensity adjustment unit moves relative to the to-be-exposed film so as to perform scanning exposure on the to-be-exposed film.

10. The exposure system according to claim 1, wherein the processing module includes an A/D conversion sub-module and a computation sub-module, the A/D conversion sub-module is electrically connected to both the light collection module and the computation sub-module, and is configured for converting the analog signal into a digital signal, and the computation sub-module is configured for computing to obtain the thicknesses of the to-be-exposed film according to the digital signal.

11. The exposure system according to claim 1, wherein the to-be-exposed film is divided into a plurality of to-be-exposed regions, the thickness measurement unit is configured for measuring the thickness of each of the to-be-exposed regions of the to-be-exposed film, and the light intensity adjustment unit is configured for adjusting an exposure-light intensity of each to-be-exposed region according to the thickness of the to-be-exposed region of the to-be-exposed film.

12. The exposure system according to claim 1, wherein the exposure system further includes a movement mechanism, which is connected to the thickness measurement unit, configured for moving the thickness measurement unit to different regions of the to-be-exposed film, and configured for moving the thickness measurement unit beyond the to-be-exposed film after completion of measurement.

13. The exposure system according to claim 1, wherein the exposure-light intensities of different regions of the to-be-exposed film are proportional to the thicknesses of corresponding regions of the to-be-exposed film.

* * * * *